US 6,523,249 B1

(12) United States Patent
Matsumoto et al.

(10) Patent No.: US 6,523,249 B1
(45) Date of Patent: Feb. 25, 2003

(54) MOUNTING METHOD OF IC CHIP AND MANUFACTURING METHOD OF HEAD SUSPENSION ASSEMBLY WITH THE IC CHIP

(75) Inventors: Takao Matsumoto, Tokyo (JP); Takeshi Wada, Tokyo (JP); Atsushi Hirose, Tokyo (JP); Mitsuyoshi Kawai, Tokyo (JP); Masashi Shiraishi, Tokyo (JP)

(73) Assignee: TDK Corporation, Tokyo (JP)

( * ) Notice: Subject to any disclaimer, the term of this patent is extended or adjusted under 35 U.S.C. 154(b) by 163 days.

(21) Appl. No.: 09/706,691

(22) Filed: Nov. 7, 2000

(30) Foreign Application Priority Data

Nov. 9, 1999 (JP) .......................... 11-318283

(51) Int. Cl.[7] ............................... G11B 5/127
(52) U.S. Cl. ................ 29/603.03; 29/603.04; 228/1
(58) Field of Search ................ 29/603.1, 603.04, 29/832, 840, 843; 228/110.1, 1.1, 102, 103, 8, 180.5, 4.5

(56) References Cited

U.S. PATENT DOCUMENTS 3,610,506 A * 10/1971 Robinson .................. 156/73.1
5,715,117 A 2/1998 Brooks ...................... 360/104
6,202,288 B1 * 3/2001 Shiraishi et al. ......... 29/603.03

FOREIGN PATENT DOCUMENTS

JP 4-279040 10/1992

OTHER PUBLICATIONS

Copy of Australian Patent Office Examination Report for corresponding Australian Patent Application No. SG 200005852–9 dated May 13, 2002.
Copy of Australian Patent Office Search Report for corresponding Australian Patent Application No. SG 200005852–9 dated May 13, 2002.

* cited by examiner

Primary Examiner—Charles G. Freay
Assistant Examiner—Emmanuel Sayoc
(74) Attorney, Agent, or Firm—Armstrong, Westerman & Hattori, LLP (57) ABSTRACT

A method of mounting an IC chip on a suspension having connection pads. The IC chip has a circuit for a thin-film magnetic head element and connection terminals connected to the circuit. The method includes a step of increasing a load applied to the IC chip so that metal bumps formed on the connection terminals press the connection pads formed on the suspension, respectively, and a step of starting application of the ultrasonic vibration to the IC chip during the increasing of the load applied to the IC chip.

11 Claims, 5 Drawing Sheets

MOUNTING METHOD OF IC CHIP AND MANUFACTURING METHOD OF HEAD SUSPENSION ASSEMBLY WITH THE IC CHIP

FIELD OF THE INVENTION

The present invention relates to a method of mounting an IC (integrated circuit) chip for a thin-film magnetic head element used for a magnetic disk device, for example, and to a method of manufacturing a head suspension assembly (HSA) with the IC chip.

DESCRIPTION OF THE RELATED ART

In a magnetic disk device, a thin-film magnetic head element for writing magnetic information into and/or reading magnetic information from a magnetic disk is, in general, formed on a magnetic head slider flying in operation above the rotating magnetic disk. The slider is supported by a suspension made of a resilient thin metal plate extended from one end of each movable arm of the magnetic disk device.

Recently, recording frequencies in the magnetic disk have rapidly increased to satisfy the requirement for ever increasing data storage capacities and densities in today's magnetic disk devices. In order to realize higher frequency recording, an HSA structure has been proposed with a suspension for supporting both a magnetic head slider and a drive IC chip of a driver circuit for the magnetic head element. According to this structure, because the length of trace conductors from the driver circuit to the magnetic head element can be shortened, generation of undesirable noise from the trace conductors can be effectively suppressed, resulting in improved high frequency recording characteristics.

Such an IC chip may be, however, heated to a high temperature as a result of the writing current flowing through it during recording operations. In order to cool the heated IC chip by air flowing produced by the rotating magnetic disk, the IC chip will be mounted on a surface of the suspension, which counters the magnetic disk surface in operation.

The HSA with the IC chip will have a greater thickness increased by the mounting height of the IC chip. Generally, in the magnetic disk device, in order to increase the record capacity per magnetic disk, both sides of the disk are used for recording, and in addition, a plurality of such the magnetic disks are axially mounted. Therefore, two HSAs for writing/reading magnetic information will exist between the two magnetic disks, and, thus, the whole thickness of the magnetic disk device equipped with the HSAs with IC chips becomes great. This large thickness of the magnetic disk device will become a big problem particularly when the magnetic disk device is mounted in a thin notebook type personal computer.

Therefore, it is required for such an IC chip to be fabricated to be thinner than a general-purpose IC chip. Namely, the general-purpose IC chip has a thickness of about 0.3–0.4 mm, whereas the IC chip for the thin-film magnetic head has a thickness less than 0.25 mm, preferably a thickness of about 0.12 mm.

The C4 (Controlled Collapse Chip Connection) process is a typical process for mounting such an IC chip on a suspension. In the C4 process, first, flux for solder material is applied to bump balls of the IC chip and then the IC chip is bonded to connection pads by reflow head bonding.

If the mounting of the IC chip is performed by the reflow soldering using flux, it is necessary to execute the cleaning process after bonding. Namely, int eh C4 bonding process, flux is applied to the suspension at a position to which the IC chip is bonded, in order to promote melting of the solder and to temporarily adhere the IC chip to the suspension during reflow soldering. Because the applied flux may have adverse effect of producing gas, for example, the cleaning has to be done after bonding.

This cleaning process will exert an influence upon the suspension. Namely, although high accuracy is required in a bending angle of the suspension, this bending angle may unintentionally change during the cleaning process. Thus, it is difficult to use the C4 process in the mounting of the IC chip on the suspension.

An ultrasonic bonding can be carried out without executing the cleaning process. In the ultrasonic bonding process, no solder bump is used but gold (Au) bumps formed on the IC chip are used. Namely, bonding is executed by applying an appropriate pressure and ultrasonic vibration to the Au bumps that are contacting with the respective Au pads on the suspension so as to fuse the Au. Because no soldering flux is utilized in this ultrasonic bonding process, no cleaning process is necessary.

However, if a heavy load and great ultrasonic power are applied to the very thin and small IC chip for the thin-film magnetic head element in order to mount it in the ultrasonic bonding process, damage such as scratches or cracks may be produced on the IC chip surface.

Even if few defects such as scratches or cracks arise on the IC chip surface, a silicon particle may fall from this IC chip. This is never allowed in the magnetic disk device. Namely, in the magnetic disk device, generally, because the magnetic head slider flies at extremely low height above the rotating disk for performing reading/writing operations, no dust is allowed to exist. Thus, it is very difficult to determine the conditions for mounting the IC chip using the ultrasonic bonding process.

SUMMARY OF THE INVENTION

It is therefore an object of the present invention to provide a method of mounting an IC chip and a method of manufacturing a HSA with the IC chip, whereby no damage occurs on a body of the IC chip even if the IC chip is very thin and very small.

According to the present invention, a method of mounting an IC chip on a suspension is provided. The suspension has connection pads, and the IC chip has a circuit for a thin-film magnetic head element and connection terminals connected to the circuit. The mounting method includes a step of increasing a load applied to the IC chip so that metal bumps formed on the connection terminals press the connection pads formed on the suspension, respectively, and a step of starting application of ultrasonic vibration to the IC chip during the increasing of the load applied to the IC chip.

Also, according to the present invention, a method of manufacturing an HSA with a suspension and an IC chip is provided. The suspension has connection pads, and the IC chip has a circuit for a thin-film magnetic head element and connection terminals connected to the circuit. The manufacturing method includes a step of forming metal bumps on the connection terminals, a step of positioning the IC chip so that the metal bumps oppose to the connection pads formed on the suspension, respectively, a step of increasing a load applied to the IC chip so that the metal bumps press the connection pads formed on the suspension, and a step of starting application of ultrasonic vibration to the IC chip during the increasing of the load applied to the IC chip to mount the IC chip on the suspension.

If the application of the ultrasonic vibration is started while the load applied to the IC chip is increasing, top ends of the metal bumps, which have a convex shape, are softened by the ultrasonic vibration, and are pushed by the applied load against the connection pads of the suspension. Also, this load applied to the IC chip is increasing. Thus, the metal bumps are bonded with the connection pads by means of melting and crushing their top ends. As a result, although the IC chip for the thin film magnetic head element is very thin and very small, sufficient mounting intensity can be obtained without applying an unnecessarily large load to the body of the IC chip.

In other words, according to the present invention, the ultrasonic bonding can be performed without generating damage on the surface of the IC chip. Even if the IC chip is very thin and small, because the mounting is possible under the lower ultrasonic power and load, a decrease of inspection items at the time of actual fabrication and an improvement in quality can be expected. Therefore, the productivity can be greatly improved.

It is preferable that the load is increased to a predetermined value, kept at a predetermined value for a predetermined period of time, and then decreased.

It is also preferable that the load is increased to a first predetermined value, kept at the first predetermined value for a first predetermined period of time, increased to a second predetermined value, kept at the second predetermined value for a second predetermined period of time, and then decreased.

It is preferable that the application of ultrasonic vibration to the IC chip is finished during the application of the load of the IC chip.

It is further preferable that the application of the ultrasonic vibration to the IC chip is finished during the increasing of the load applied to the IC chip.

Preferably, the metal bumps are gold bumps or copper bumps. Also, preferably, the connection pads are made of gold or copper.

It is preferable that the suspension is fabricated by forming a trace conductor member and the connection pads connected to the trace conductor member on a resilient flexure, and by fixing the flexure to a resilient load beam.

Further objects and advantages of the present invention will be apparent from the following description of the preferred embodiments of the invention as illustrated in the accompanying drawings.

DESCRIPTION OF THE PREFERRED EMBODIMENTS

Figure 1:
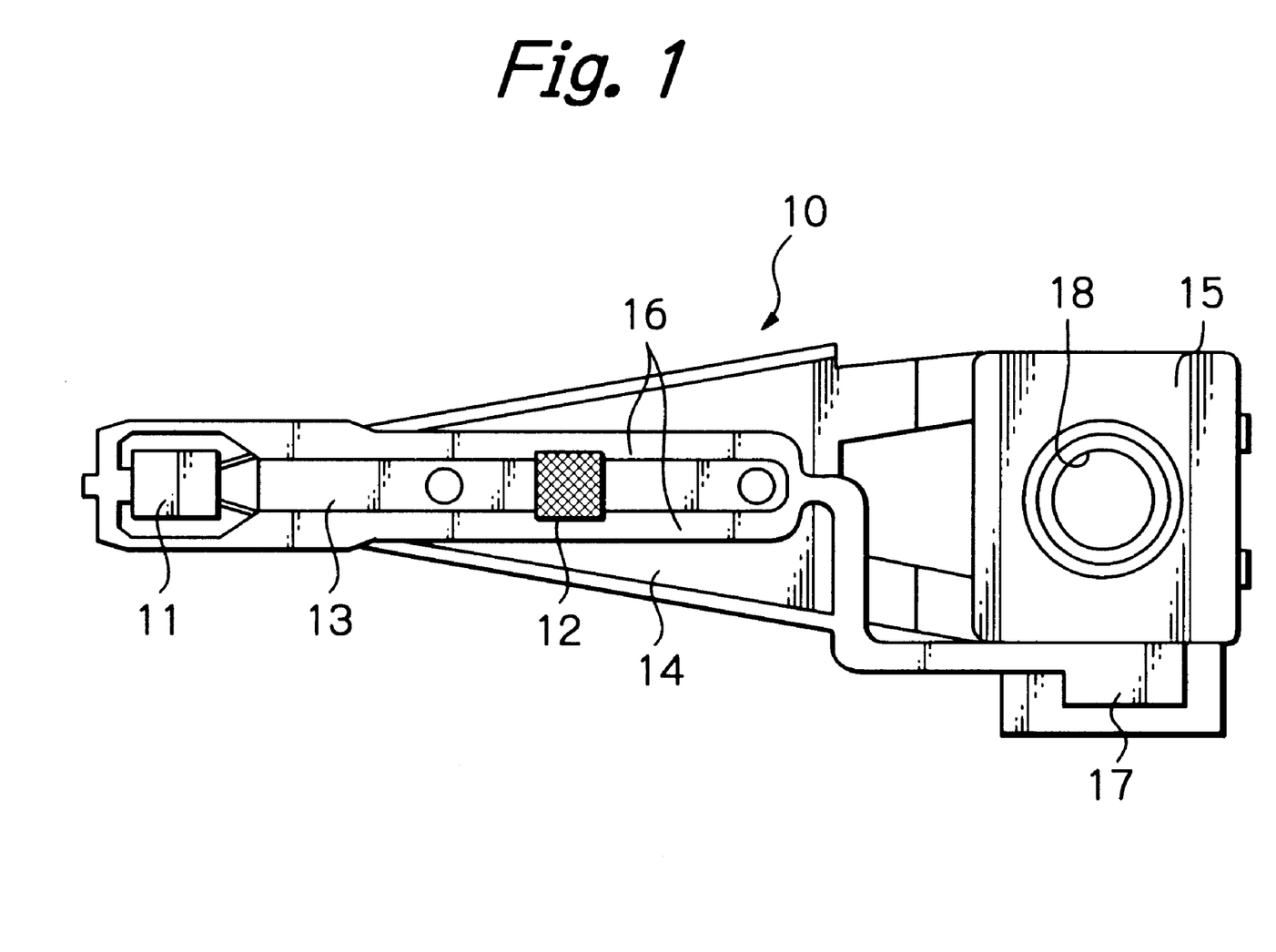
FIG. 1 shows a plane view of a preferred embodiment of a HSA according to the present invention.

FIG. 1 schematically illustrates a head suspension assembly (HSA) as a preferred embodiment of the present invention.

As shown in the figure, the HSA is assembled by fixing a slider 11 having a thin-film magnetic head element to a top end section of a suspension 10, and by mounting a drive IC chip 12 at a middle location of this suspension 10. The slider 11 and the drive IC chip 12 are fixed on a surface of the suspension 10, which will oppose the magnetic disk surface in operation. This surface of the suspension is called hereinafter a "slider-attached surface".

The suspension 10 is substantially constituted by a resilient flexure 13 for carrying the slider 11 at its tongue located near its top end section and supports the drive IC chip 12 at its middle section, a resilient load beam 14 for supporting and fixing the flexure 13, and a base plate 15 formed at a base end section of the load beam 14.

The load beam 14 has elasticity for suppressing the slider 11 toward the direction of the magnetic disk in operation. The flexure 13 has a flexible tongue centered by a dimple formed on the load beam 14 and has elasticity for supporting the slider 11 flexibly by this tongue. As will be noted, in this embodiment, the suspension 10 has a three-pieces structure constituted by individual components of the flexure 13, the load beam 14 and the base plage 15. In such a three-pieces structure, the stiffness of the flexure 13 is set to be lower than that of the load beam 14.

In the drive IC chip 12, an integrated driver circuit constituting a head amplifier of the magnetic head element is formed. Although it these are mere examples, the size of the IC chip 12 maybe 1.0 mm×1.0 mm×0.15 mm or 1.5 mm×1.5 mm×0.25 mm. The fixed position of the IC chip 12 on the suspension 10 is in this embodiment determined so as to improve head radiation characteristics and electromagnetic characteristics and to make mounting of the IC chip easy.

The flexure 13 is made of, in this embodiment, a stainless steel plate (for example, SUS304TA) with a thickness of about 25 $\mu$m. This flexure 13 has a uniform width smaller than that of the load beam 14.

A trace conductor layer 16 of a thin-film pattern that constitutes a necessary number of input/output signal lines is formed on the flexure 13 along its length. One end of the trace conductor 16 is connected to slider-connection pads for making electrical connections with the magnetic head slider 11 formed at the top end section of the flexure 13, and the other end of the trace conductor 16 is connected via the IC chip 12 to external connection pads 17 which will be connected to external circuits.

The load beam 14 is made of, in this embodiment, a resilient stainless steel plate with a thickness of about 60–65 $\mu$m and supports the flexure 13 along its entire length. This load beam 14 has a shape with a width that narrows while approaching its top end. Fixing of the flexure 13 to the load beam 14 is achieved by means of a plurality of welded spots.

The base plate 15 is made of a stainless steel or iron and is fixed to the base end section of the load beam 14 by welding. The suspension 10 will be attached to each movable arm (not shown) by fixing an attachment part 18 of the base plate 15 to the movable arm.

In modification, the suspension may be formed in a two-pieces structure with a base plate and a flexure-load beam instead of the three-pieces structure with the flexure 13, the load beam 14 and the base plate 15.

As aforementioned, the slider 11 with the magnetic head element is mounted on the tongue of the flexure 13 at the top end section of the suspension 10. The trace conductor layer 16, which includes the necessary number of the input/output signal lines, passes both sides of the slider 11 and turns back at the top end section of the flexure 13 to the slider-connecting pads so as to be electrically connected with input/output electrodes of the slider 11. The insulation material layer made of the resin covers the connection part.

The drive IC chip 12 is mounted on the slider-attached surface at the middle length location of the suspension 10. The IC chip 12, in this embodiment, is formed by a bear chip and mounted, by the ultrasonic bonding, on and connected to chip-connection pads formed on the flexure 13 of the suspension 10 via an insulation material layer.

An underfill is used to fill in a clearance between the bottom surface of the IC chip 12 and the trace conductor layer surface so as to improve heat radiation characteristics, to improve mechanical strength of this area, and to cover a part of the IC chip 12.

Hereinafter, a process of mounting the IC chip 12 to the suspension, according to this embodiment, will be described with reference to FIGS. 2a to 2e.

Figure 2A:
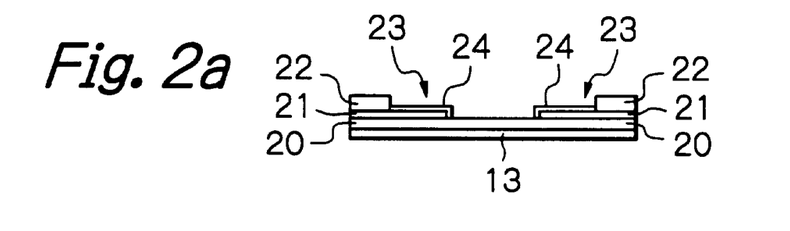
FIGS. 2a to 2e show sectional views illustrating a part of manufacturing processes of the HSA according to the embodiment shown in FIG. 1.

As shown in FIG. 2a, on the flexure 13 that is made of stainless steel plate, the thin-film conductive pattern is formed by a well-known method similar to the patterning method of forming a printed circuit board on a thin metal plate, such as a flexible printed circuit (FPC).

For example, the conductive pattern is formed by sequentially depositing a first insulation material layer 20 made of a resin such as polyimide with a thickness of about 5 $\mu$m, a patterned Cu (copper) layer (conductive layer) 21 with a thickness of about 4 $\mu$m, and a second insulation material layer 22 made of a resin such as polyimide with a thickness of about 5 $\mu$m on the flexure 13 in this order. Within the regions of the slider-connection pads to the magnetic head slider, external-connection pads to the external circuit and chip-connection pads 23 to the IC chip 12, only an Au layer 24 is deposited on the Cu layer 21 and there is no second insulation material layer on the Au layer 24.

Figure 2B:
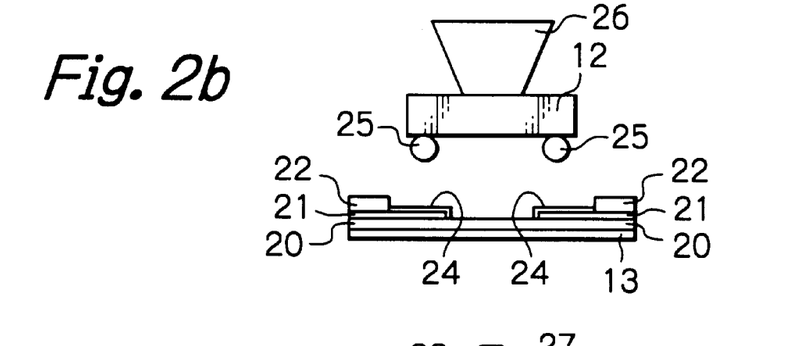

As shown in FIG. 2b, bumps 24 of Au balls are preliminarily made on connection terminals (not shown) formed on the bottom face of the IC chip 12. This IC chip 12 is picked up by a ultrasonic bonding head or nozzle 26 that is in contact with the top face of the IC chip by the bonding head as shown in FIG. 2b, and aligned with the chip-connection pads 23 of the thin-film conductive pattern.

Figure 2C:
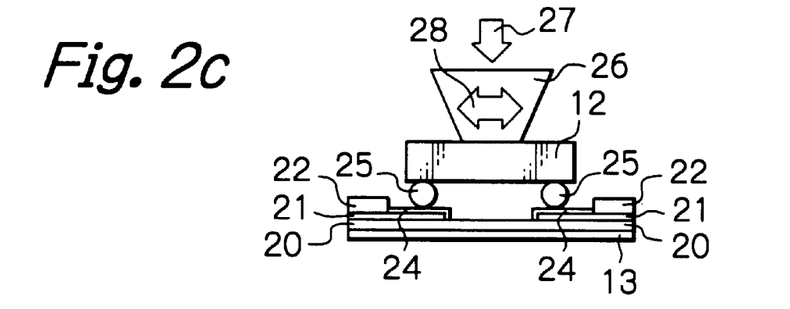

Then, the nozzle 26 moves down until the Au ball bumps 25 of the IC chip 12 come in contact with the respective chip-connection pads 23 of the thin-film conductive pattern, and presses the IC chip 12 toward a direction of an arrow 27, as shown in FIG. 2c, so as to apply a load onto the IC chip 12. This applied load is gradually increased.

During the increasing of the load, ultrasonic vibration along directions of an arrow 28 (lateral directions) is applied from the ultrasonic head 26, as shown in FIG. 2c.

The depression due to the load and the application of ultrasonic vibration result fused bonding of the Au ball bumps 25 of the IC chip 12 with the Au layer 24 of the chip-connection pads 23.

Figure 2D:
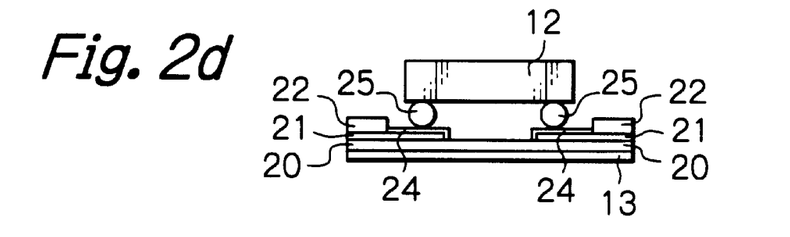

Thus, as shown in FIG. 2d, electrical connection between the connection terminals of the IC chip 12 and the chip-connection pads 23 is achieved.

Figure 2E:
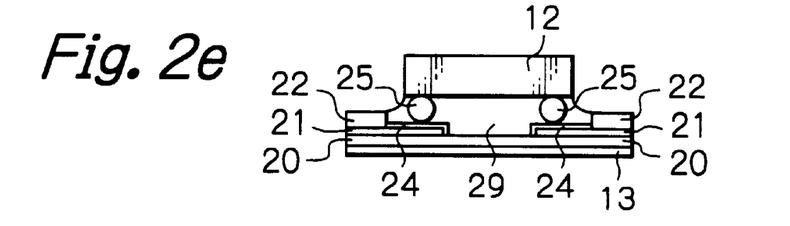

Then, as shown in FIG. 2e, an underfill 29 in a liquid state for improving head radiation characteristics, improving mechanical strength of this area, and covering a part of the IC chip 12 is injected into a clearance between the bottom face of the IC chip 12 and the surface of the thin-film conductive pattern. The underfill 29 is a good head conductivity material made of, for example, a mixture of a resin such as epoxy resin and insulation material with good heat conductivity. the underfill 29 will be cured during heat and dry process to be executed later.

The underfill resin with good heat conductivity composing the underfill layer 29 may be, for example, a resin such as epoxy resin containing fused silica (heat conductivity ratio of about $50.4 \times 10^{-6}$ W/m·° C.), a resin containing crystal silica (heat conductivity ratio of about $147 \times 10^{-6}$ W/m·° C.), or a resin containing aluminum nitride (heat conductivity ratio of about $168 \times 10^{-6}$ W/m·° C.).

According to the embodiment, because the Au ball bumps 25 of the IC chip 12 are electrically and mechanically bonded with the Au layer 24 of the chip-connection pads 23 by the ultrasonic fused bonding, no temporal fixing of the IC chip nor reflow soldering is required.

The ultrasonic bonding process according to this embodiment will be now described in detail in comparison with the conventional ultrasonic bonding process.

Figure 3:
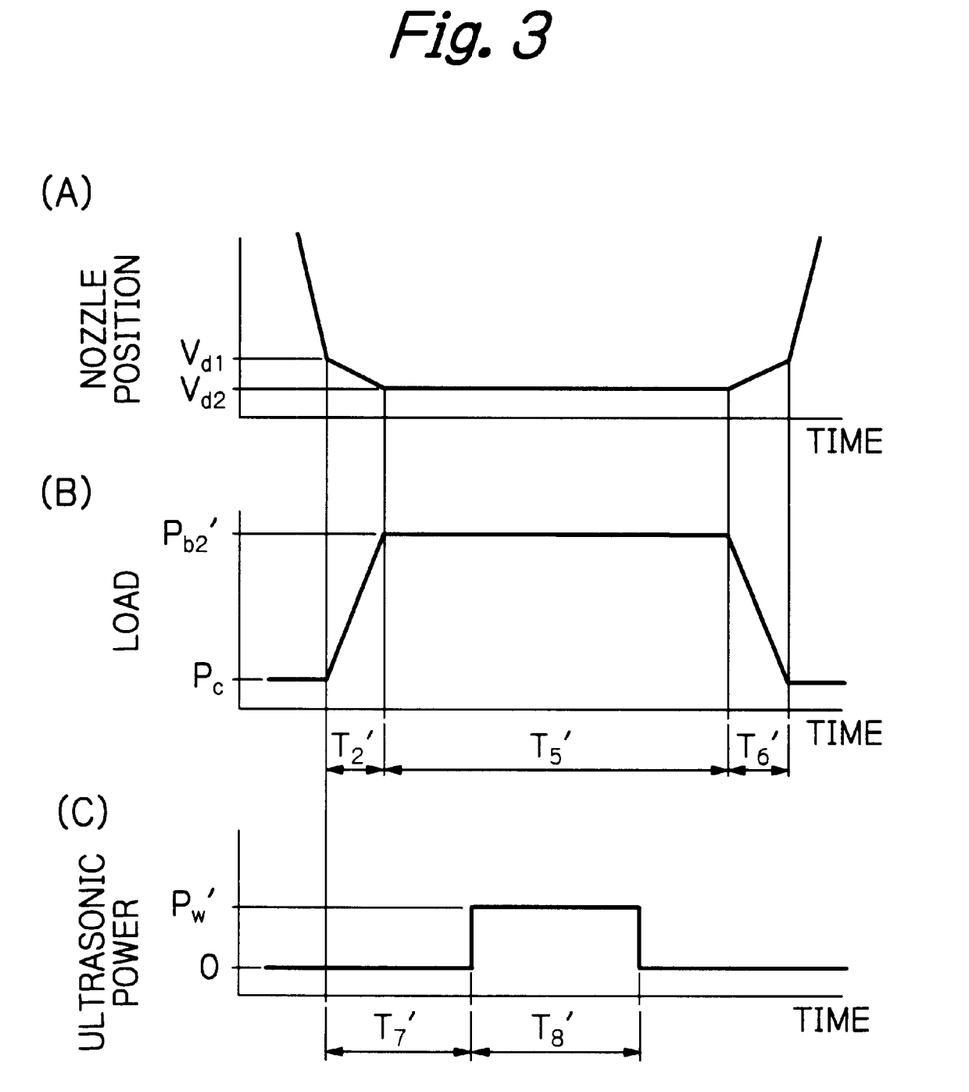
FIG. 3 shows graphs illustrating ultrasonic bonding conditions according to the conventional technique.

FIG. 3 illustrates ultrasonic bonding conditions in the conventional ultrasonic bonding process. In the figure, (A) denotes characteristics of a relative height or position of the ultrasonic bonding head from the chip-connection pads with respect to time, (B) characteristics of a load applied to the IC chip with respect to time, and (C) characteristics of an ultrasonic power applied to the IC chip with respect to time.

The ultrasonic bonding head moves down and, thus, the bumps of the IC chip come in contact with the chip-connection pads at $V_{d1}$ shown in FIG. 3(A). As shown in FIG. 3(B), a load at this point is represented as a contact load $P_c$. The load is increased from this contact load $P_c$ for a time period $T_2'$. When the load reaches a predetermined load $P_{b2}'$(equal to about 13.72 N), this load is kept at that value for a predetermined time period $T_5'$.

As shown in FIG. 3(C), when the load begins to increase above the contact load $P_c$, a timer starts. Then, when the timer exceeds a time period $T_7'$, application of the ultrasonic vibration starts with an ultrasonic power of $P_w'=1.4$ W for the ultrasonic bonding. This starting point of the ultrasonic vibration application is set within a period where the load is kept at the load $P_{b2}'$. The application of ultrasonic vibration is continued for a time period of $T_8$, and then finished.

After the predetermined time $T_5'$ has elapsed, the load is reduced to the contact load $P_c$ for a time period $T_6'$ and then the ultrasonic bonding head moves upward to end the bonding process.

Figure 4:
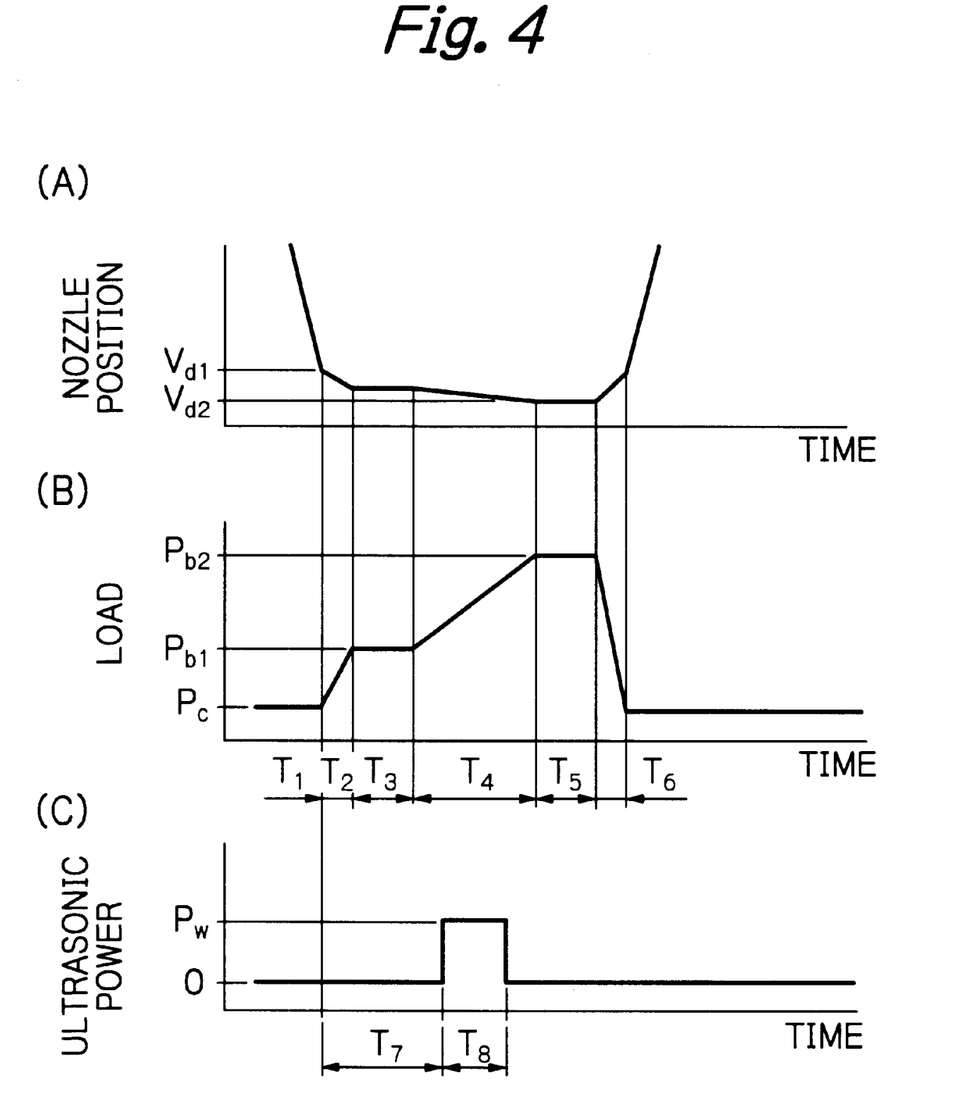
FIG. 4 shows graphs illustrating ultrasonic bonding conditions according to the embodiment shown in FIG. 1.

FIG. 4 illustrates ultrasonic bonding conditions in the aforementioned embodiment. In the figure, (A) denotes characteristics of a relative height or position of the ultrasonic bonding head 26 from the chip-connection pads 23 with respect to time, (B) characteristics of a load applied to the IC chip 12 with respect to time, and (C) characteristics of an ultrasonic power applied to the IC chip 12 with respect to time.

The ultrasonic bonding head 26 moves down and, thus, the bumps 25 of the IC chip 12 come in contact with the chip-connection pads 23 at $V_{d1}$ shown in FIG. 4(A). As shown in FIG. 4(B), a load at this point is represented as a contact load $P_c$. The load is increased from this contact load $P_c$ for a time period $T_2$. When the load reaches a first predetermined load $p_{b1}$ (equal to about 1.96 N), this load $p_{b1}$ is kept at that value for a first predetermined time period $T_3$. After the first predetermined time $T_3$ elapsed, the load is increased from the value $P_{b1}$ for a time period $T_4$. When then the load reaches a second predetermined load $P_{b2}$ (equal to about 4.9N), this load $P_{b2}$ is kept at that value for a second predetermined time period $T_5$.

As shown in FIG. 4(C), when the load begins to increase above the contact load $P_c$, a timer starts. Then, when the timer exceeds a time period $T_7$, application of the ultrasonic vibration starts with a low ultrasonic power of $P_w'=0.2$ W for the ultrasonic bonding. This starting point of the ultrasonic vibration application is set within a period where the load is increasing from the first predetermined load $P_{b1}$ to the second predetermined load $P_{b2}$, that is, during the time period $T_4$. The application of ultrasonic vibration is continued for $T_8$ and then terminated. In the embodiment, the finishing point of the ultrasonic vibration application is set also within this period where the load is increasing from the first predetermined load $P_{b1}$ to the second predetermined load $P_{b2}$, that is, during the time period $T_4$.

The application of ultrasonic vibration is continued for $T_8$ and then finished. In the embodiment, the finishing point of the ultrasonic vibration application is set also within this period where the load is increasing from the first predetermined load $P_{b1}$ to the second predetermined load $P_{b2}$, that is, during the time period $T_4$.

After the predetermined time $T_5$ elapsed, the load is reduced to the contact load $P_c$, for a time period $T_6$ and then the ultrasonic bonding head 26 moves upward to end the bonding process.

As described in detail, according to the conventional ultrasonic bonding method, the application of the ultrasonic vibration starts when the load is reached and kept at the value $P_{b2}'$. As for a large and thick general-purpose IC chip, because it has a sufficient power apply area and can bear a great load applied thereto, there will occur no problem for such conventional ultrasonic bonding conditions. However, because the IC chip for the thin-film magnetic head is very thin and small, if the conventional ultrasonic bonding conditions are adopted, serious defects such as scratches or cracks, may be produced on the IC chip surface.

Whereas according to the ultrasonic bonding method of this embodiment, the ultrasonic vibration application starts within a period where the load is increasing from the first predetermined load $P_{b1}$ to the second predetermined load $P_{b2}$. Therefore, the Au bumps 25 of the IC chip 12 in the softened state due to the received ultrasonic vibration come in contact with the Au layer 24 of the chip-connection pads 23 and are pushed against the chip-connection pads 23. Namely, the Au bumps 25 are bonded with the Au layer 24, by melting. Because the IC chip for the thin-film magnetic head element is very thin and small, and furthermore, there are few bumps on the IC chip, bonding can be performed by only applying very low ultrasonic power if the bumps are bonded, melting. As a result of a minimal ultrasonic amplitude, precise positioning of the IC chip at mounting can be expected. Also, damages to the surface of the IC chip can be prevented from occurring because of the lower ultrasonic power and load applied to the IC chip. As a result, a silicon particle falling from the IC chip as a result of the damages on its surface, which is never allowed in the magnetic disk device, can be prevented.

Figure 5:
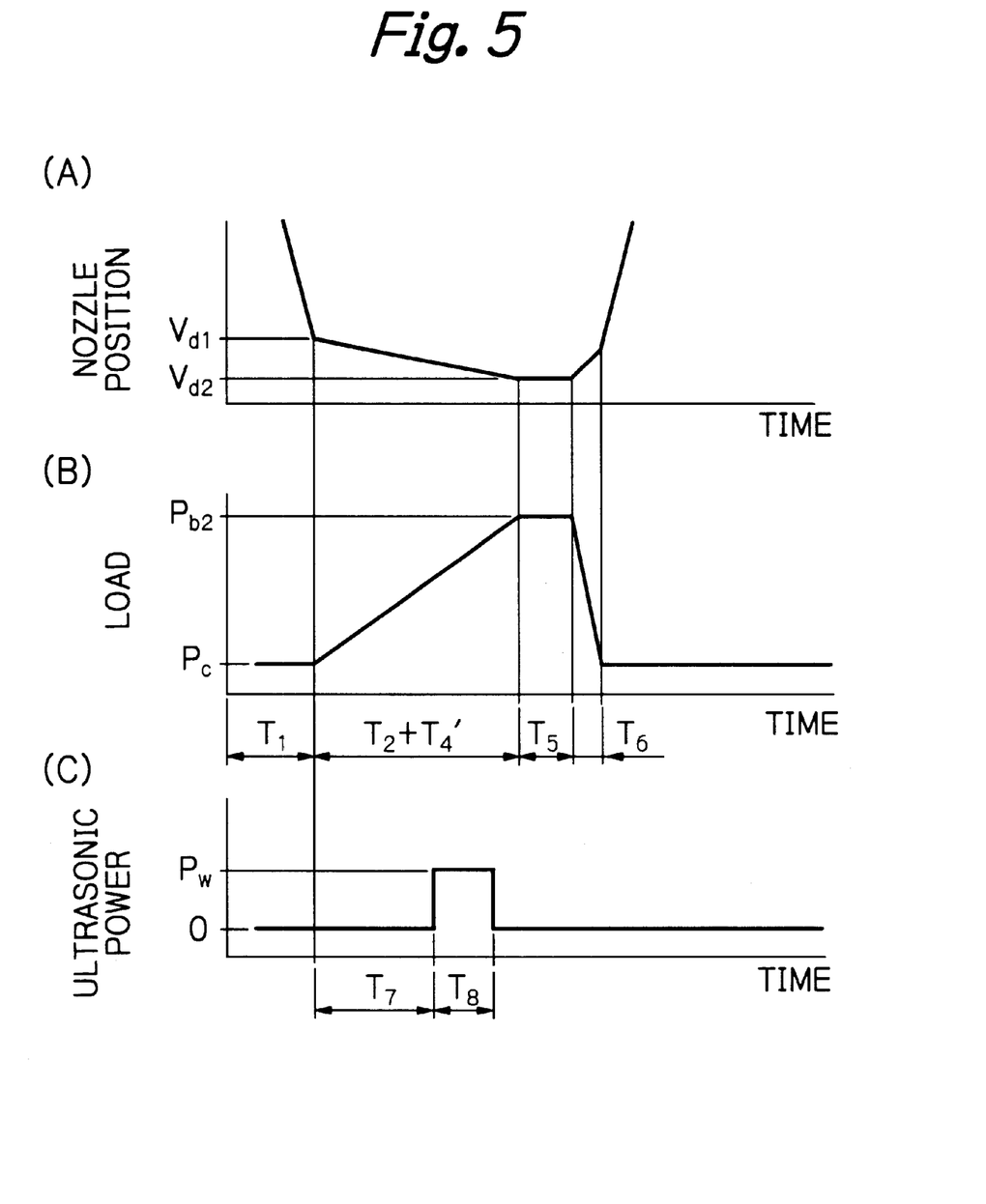
FIG. 5 shows graphs illustrating ultrasonic bonding conditions according to another embodiment of the present invention.

FIG. 5 illustrates ultrasonic bonding conditions according to another embodiment of the present invention. Configurations, operations and advantages in this embodiment are the same as these of the embodiment shown in FIG. 1, except for the ultrasonic bonding conditions. Thus, in this embodiment, the same reference numerals as these in the embodiment of FIG. 1 are used.

In FIG. 5, (A) denotes characteristics of a relative height or position of the ultrasonic bonding head 26 from the chip-connection pads 23 with respect to time, (B) characteristics of a load applied to the IC chip 12 with respect to time, and (C) characteristics of an ultrasonic power applied to the IC chip 12 with respect to time.

The ultrasonic bonding head 26 moves down and, thus, the bumps 25 of the IC chip 12 come in contact with the chip-connection pads 23 at $V_{d1}$ shown in FIG. 5(A). As shown in FIG. 5(B), a load at this point is represented as a contact load $P_c$. The load is increased from this contact load $P_c$ for a time period $T_2$ plus $T_4'$. When the load reaches a predetermined load $P_{b2}$ (equal to about 4.9 N), this load $P_{b2}$ is kept at that value for a predetermined time period $T_5$.

As shown in FIG. 5(C), when the load begins to increase above the contact load $P_c$, a timer starts. Then, when the timer exceeds a time period $T_7$, application of the ultrasonic vibration starts with a low ultrasonic power of $P_w'=0.2$ W for the ultrasonic bonding. This starting point of the ultrasonic vibration application is set within a period where the load is increasing from the contact load $P_c$ to the predetermined load $P_{b2}$, that is, during the time period $T_2$ plus $T_4'$. The application of ultrasonic vibration is continued for $T_8$ and then finished. In the embodiment, the finishing point of the ultrasonic vibration application is set also within this period where the load is increasing from the contact load $P_c$ to the predetermined load $P_{b2}$, that is, during the time period $T_2$ plus $T_4'$.

After the predetermined time $T_5$ elapsed, the load is reduced to the contact load $P_c$ for a time period $T_6$ and then the ultrasonic bonding head 26 moves upward to end the bonding process.

According to the ultrasonic bonding method of this embodiment, the ultrasonic vibration application starts within a period where the load is increasing from the contact load $P_c$ to the predetermined load $P_{b2}$. Therefore, the Au bumps 25 of the IC chip 12 in the softened state due to the received ultrasonic vibration come in contact with the Au layer 24 of the chip-connection pads 23 and are pushed against the chip-connection pads 23. namely, the Au bumps 25 are bonded with the Au layer 24, by melting. Because the IC chip for the thin-film magnetic head element is very thin and small, and furthermore, there are few bumps on the IC chip, bonding can be performed by very low ultrasonic power if the bumps are bonded, melting. Thanks for a minimal ultrasonic amplitude, precise positioning of the IC chip at mounting can be expected. Also, damages on the surface of the IC chip can be prevented form occurring because of the lower ultrasonic power and load applied to the IC chip. As a result, a silicon particle falling from the IC chip due to the damages on its surface, which is never allowed in the magnetic disk device, can be prevented.

In the aforementioned embodiments, the finishing point of the ultrasonic vibration application is set within the period where the load is increasing. However, this finishing point can be set at any time after the bonding is actually performed.

In the aforementioned embodiments, also, the Au ball bumps 25 of the IC chip 12 and the Au layer 24 of the chip-connection pads 23 are bonded by ultrasonic bonding. However, the present invention can be achieved by ultrasonic bonding using Cu balls and a Cu layer or using another metal balls and another metal layer instead of the Au balls and the Au layer. In modifications, the bumps may be formed on the chip-connection pads of the thin-film conductive pattern.

Furthermore, according to the embodiments, because the ultrasonic bonding step is used, no transfer process of solder flux and also no reflow soldering process are needed, and therefore no cleaning process is needed. Still further, because the application of the ultrasonic vibration step is started during increasing of the load, no damage occurs on the surface of the silicon body of the IC chip during its mounting process resulting from a silicon particle falling from the IC chip.

It is apparent that the characteristics of the load and the ultrasonic power applied to the IC chip with respect to time in the ultrasonic bonding conditions according to the present invention are not limited to that in the aforementioned embodiments. Any load and ultrasonic power characteristics can be adopted if the application of the ultrasonic vibration is started during increasing of the load so as to perform the bonding by applying a lower load and a lower ultrasonic power.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of mounting an IC chip on a suspension having connection pads, said IC chip having a circuit for a thin-film magnetic head element and connection terminals connected to said circuit, said method comprising the steps of:

increasing a load applied to said IC chip so that metal bumps formed on said connection terminals press said connection pads formed on said suspension, respectively, said load being increased to a first predetermined value, kept at the first predetermined value for a first predetermined period of time, increased to a second predetermined value, kept at the second predetermined value for a second predetermined period of time, and then decreased; and starting application of ultrasonic vibration to said IC chip during the increasing of the load applied to said IC chip from said first predetermined value to said second predetermined value.

2. The method as claimed in claim 1, wherein said application of ultrasonic vibration to said IC chip is finished during the application of the load to said IC chip.

3. The method as claimed in claim 1, wherein said application of ultrasonic vibration to said IC chip is finished during the increasing of the load applied to said IC chip.

4. The method as claimed in claim 1, wherein said metal bumps are gold bumps or copper bumps.

5. The method as claimed in claim 1, wherein said connection pads are made of gold or copper.

6. A method of manufacturing a head suspension assembly with a suspension having connection pads, and an IC chip having a circuit for a thin-film magnetic head element and connection terminals connected to said circuit, said method comprising the steps of:

forming metal bumps on said connection terminals;

positioning said IC chip so that said metal bumps oppose said connection pads formed on said suspension, respectively;

increasing a load applied to said IC chip so that said metal bumps press said connection pads formed on said suspension, said load being increased to a first predetermined value, kept at the first predetermined value for a first predetermined period of time, increased to a second predetermined value, kept at the second predetermined value for a second predetermined period of time, and then decreased; and starting application of ultrasonic vibration to said IC chip during the increasing of the load applied to said IC chip to mount said IC chip on said suspension from said first predetermined value to said second predetermined value.

7. The method as claimed in claim 6, wherein said application of ultrasonic vibration to said IC chip is finished during the application of the load to said IC chip.

8. The method as claimed in claim 6, wherein said application of ultrasonic vibration to said IC chip is finished during the increasing of the load applied to said IC chip.

9. The method as claimed in claim 6, wherein said metal bumps are gold bumps or copper bumps.

10. The method as claimed in claim 6, wherein said suspension is fabricated by forming a trace conductor member and said connection pads connected to said trace conductor member on a resilient flexure, and by fixing said flexure to a resilient load beam.

11. The method as claimed in claim 6, wherein said connection pads are made of gold or copper.

* * * * *